(12) United States Patent
Kim et al.

(10) Patent No.: US 11,549,988 B2
(45) Date of Patent: Jan. 10, 2023

(54) METHOD AND APPARATUS FOR ESTIMATING STATE OF BATTERY

(71) Applicant: Samsung Electronics Co., Ltd., Suwon-si (KR)

(72) Inventors: Jinho Kim, Yongin-si (KR); Taewon Song, Yongin-si (KR); Younghun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 17/329,451

(22) Filed: May 25, 2021

(65) Prior Publication Data

US 2021/0278467 A1    Sep. 9, 2021

Related U.S. Application Data

(62) Division of application No. 16/182,978, filed on Nov. 7, 2018.

(30) Foreign Application Priority Data

Dec. 18, 2017 (KR) .................. 10-2017-0173823
Oct. 2, 2018 (KR) .................. 10-2018-0117767

(51) Int. Cl.
*G01R 31/367* (2019.01)
*G01R 31/392* (2019.01)
*G01R 31/371* (2019.01)

(52) U.S. Cl.
CPC ......... *G01R 31/367* (2019.01); *G01R 31/371* (2019.01); *G01R 31/392* (2019.01)

(58) Field of Classification Search
CPC ...... H02J 7/0021; H02J 7/0016; H02J 7/0014; G01R 31/367

See application file for complete search history.

(56) References Cited

U.S. PATENT DOCUMENTS

| | | | |
|---|---|---|---|
| 6,278,257 | B1 | 8/2001 | Takada et al. |
| 8,054,038 | B2 | 11/2011 | Kelty et al. |
| 8,117,857 | B2 | 2/2012 | Kelty et al. |
| 8,508,191 | B2 | 8/2013 | Kim et al. |

(Continued)

FOREIGN PATENT DOCUMENTS

| | | |
|---|---|---|
| KR | 10-0680901 B1 | 2/2007 |
| KR | 10-2016-0141411 A | 12/2016 |
| KR | 10-2017-0020072 A | 2/2017 |

OTHER PUBLICATIONS

Rui Xiong, et al., "Cell state-of-charge estimation for the multi-cell series-connected battery pack with model bias correction approach," *Proceedings of the 6th International Conference on Applied Energy—ICAE*, Energy Procedia, vol. 61, Nov. 2014, pp. 172-175.

(Continued)

*Primary Examiner* — Lam S Nguyen
(74) *Attorney, Agent, or Firm* — NSIP Law

(57) ABSTRACT

Disclosed is a battery state estimation method and apparatus, the method including selecting sensing data of a portion of batteries, transmitting the selected sensing data to at least one estimator among estimators, transmitting sensing data of a remaining portion of the batteries to a remaining estimator among the estimators, and determining state information of the batteries using the estimators.

3 Claims, 13 Drawing Sheets

(56) References Cited

U.S. PATENT DOCUMENTS

| | | |
|---|---|---|
| 8,618,775 B2 | 12/2013 | Hermann et al. |
| 8,624,560 B2 | 1/2014 | Ungar et al. |
| 8,961,203 B2 | 2/2015 | Lee |
| 8,972,091 B2 | 3/2015 | Li et al. |
| 8,972,213 B2 | 3/2015 | Zhang et al. |
| 9,252,464 B2 | 2/2016 | Boehm et al. |
| 2012/0116699 A1 | 5/2012 | Haag et al. |
| 2013/0147434 A1 | 6/2013 | Boehm et al. |
| 2013/0344355 A1 | 12/2013 | Kozinsky et al. |
| 2014/0277866 A1 | 9/2014 | Li et al. |
| 2016/0084913 A1 | 3/2016 | Lupo et al. |
| 2016/0363632 A1* | 12/2016 | Park ................ G01R 31/396 |
| 2017/0045587 A1 | 2/2017 | Kim et al. |
| 2017/0062878 A1 | 3/2017 | Povey et al. |
| 2017/0098940 A1 | 4/2017 | Syouda |
| 2018/0097375 A1* | 4/2018 | Lee ................ G01R 31/3648 |

OTHER PUBLICATIONS

Weizhong Wang, et al., "Efficient Multi-cell SOC Estimation for Electrified Vehicle Battery Packs," *Proceedings of the IEEE Transportation Electrification Conference and Expo*, Dearborn, MI, USA, Jun. 2016 (5 pages, in English).

Extended European Search Report dated Mar. 29, 2019 in counterpart European Application No. 18210960.3 (7 pages in English).

\* cited by examiner

100

METHOD AND APPARATUS FOR ESTIMATING STATE OF BATTERY

CROSS-REFERENCE TO RELATED APPLICATIONS

This application is a divisional of Ser. No. 16/182,978 filed Nov. 7, 2018 which claims the benefit under 35 USC § 119(a) of Korean Patent Application No. 10-2017-0173823 filed on Dec. 18, 2017 and Application No. 10-2018-0117767 filed on Oct. 2, 2018 in the Korean Intellectual Property Office, the entire disclosure of which is incorporated herein by reference for all purposes.

BACKGROUND

1. Field

The following description relates to battery state estimation.

2. Description of Related Art

A state of a battery may be estimated using various methods. For example, the state of the battery may be estimated through a coulomb counting or using a battery model such as, for example, an electrical circuit model and an electrochemical model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating a state of a battery, the method including classifying batteries into at least one battery and remaining batteries, determining state information of the at least one battery during a first switching period among switching periods based on sensing data of the at least one battery during the first switching period and a first battery model, determining state information of the at least one battery during a second switching period among the switching periods, based on sensing data of the at least one battery during the second switching period and the first battery model, classifying the remaining batteries into a first target battery and a first non-target battery in the first switching period, determining state information of the first target battery during the first switching period based on sensing data of the target battery during the first switching period and a second battery model, determining state information of the first non-target battery in the first switching period based on a first state change amount of the non-target battery during the first switching period, classifying the remaining batteries into a second target battery and a second non-target battery in the second switching period, wherein the first target battery is the second non-target battery of the second switching period and the first non-target battery is the second target battery of the second switching period, determining state information of the second target battery based on sensing data of the second target battery during the second switching period and the second battery model, and determining state information of the second non-target battery based on a second state change amount of the second non-target battery in the second switching period.

The state information may be a state of charge (SOC).

Each of the first battery model and the second battery model may be an electrochemical model.

The at least one battery may include two batteries.

The two batteries may be a maximum SOC battery and a minimum SOC battery.

The first state change amount and the second state change amount may correspond to a state information change amount of the at least one battery for each of the respective switching periods or a state information change amount obtained through a coulomb counting for each of the respective switching periods.

The method of claim 1, wherein the determining of the state information of the first target battery during the first switching period may include correcting the state information of the first target battery during the first switching period.

The determining of the state information of the second target battery during the second switching period may include correcting the state information of the second target battery during the second switching period.

In another general aspect, there is provided an apparatus for estimating a state of a battery, the apparatus including a controller configured to classify batteries into at least one battery and remaining batteries, determine state information of the at least one battery during a first switching period among switching periods based on sensing data of the at least one battery during the first switching period and a first battery model, determine state information of the at least one battery during a second switching period among the switching periods, based on sensing data during the at least one battery of the second switching period and the first battery model, classify the remaining batteries into a first target battery and a first non-target battery in the first switching period, determine state information of the first target battery during the first switching period based on sensing data during the target battery of the first switching period and a second battery model, determine state information of the first non-target battery in the first switching period based on a first state change amount of the non-target battery during the first switching period, classify the remaining batteries into a second target battery and a second non-target battery in the second switching period, wherein the first target battery is the second non-target battery of the second switching period and the first non-target battery is the second target battery of the second switching period, determine state information of the second target battery based on sensing data of the second target battery during the second switching period and the second battery model, and determine state information of the second non-target battery based on a second state change amount of the second non-target battery in the second switching period.

The state information may be a state of charge (SOC).

The first battery model and the second battery model may be an electrochemical model.

The at least one battery may include two batteries.

The two batteries may be a maximum SOC battery and a minimum SOC battery.

The first state change amount and the second state change amount may correspond to a state information change amount of the at least one battery for each of the respective switching periods or a state information change amount obtained through a coulomb counting for each of the respective switching periods.

The controller may be configured to correct the state information of the first target battery during the first switching period.

The controller may be configured to correct the second state information of the second target battery during the second switching period.

In another general aspect, there is provided an apparatus for estimating a state of a battery, the apparatus including a sensor configured to sense data corresponding to batteries of a battery pack in an update period, a head-up display (HUD), and a processor comprising a comparator configured to determine, in another update period prior to the update period, a maximum battery of the batteries having a maximum state information and a minimum battery of the batteries having a minimum state information, a selector configured to selectively transmit the data corresponding to each battery of the battery pack to a plurality of estimators, a first estimator of the plurality of estimators being configured to determine state information of the maximum battery based on sensing data of the maximum battery and a first battery model, a second estimator of the plurality of estimators being configured to determine state information of the minimum battery based on sensing data of the minimum battery and a second battery model, a third estimator of the plurality of estimators being configured to select, in a switching period of the update period, a target battery from remaining batteries, the remaining batteries being the batteries other than the maximum battery and the maximum battery, determine, in the switching period, state information of the target battery based on sensing data of the target battery and a third battery model, and determine, in the switching period, state information of the remaining batteries other than the target battery based on state information of the remaining batteries other than the target battery for another switching period that is prior to the switching period and a state change amount, wherein the processor is configured to output the state information of the maximum battery, the state information of the minimum battery, the state information of the maximum battery, and the state information of remaining batteries through the head-up display (HUD).

The state change amount may include any one, any combination, or an average of a state change amount obtained through a coulomb counting for the switching period, a state change amount of the maximum battery for the switching period, and a state change amount of the minimum battery for the switching period.

The third estimator is further configured to select, other than the target battery, another target battery from the remaining batteries in other switching periods of the update periods.

Other features and aspects will be apparent from the following detailed description, the drawings, and the claims.

Figure 1:
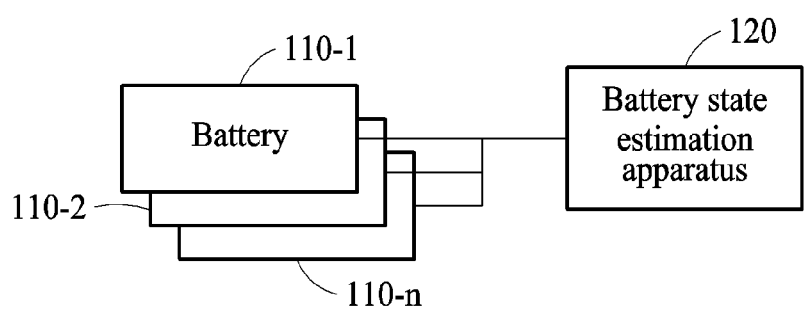
FIG. 1 illustrates an example of a battery device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise.

Regarding the reference numerals assigned to the elements in the drawings, it should be noted that the same elements will be designated by the same reference numerals, wherever possible, even though they are shown in different drawings. Also, detailed description of well-known related structures or functions will be omitted when it is deemed that such description will unnecessarily hinder understanding of structures or operations of the present disclosure.

FIG. 1 illustrates an example of a battery device 100.

Referring to FIG. 1, a battery device 100 includes batteries 110-1 through 110-n and a battery state estimation apparatus 120.

Each of the batteries 110-1 through 110-n indicates, for example, a battery cell, a battery module, and a battery pack.

The battery state estimation apparatus 120 collects sensing data of each of the batteries 110-1 through 110-n by sensing each of the batteries 110-1 through 110-n using one or more sensors. The sensing data includes, for example, any one or any combination of voltage data, current data, and temperature data, but not be limited to the example.

The battery state estimation apparatus 120 determines state information of each of the batteries 110-1 through 110-n. The state information includes, for example, a state of charge (SOC) and a state of health (SOH). Hereinafter, examples of the battery state estimation apparatus 120 determining state information of the batteries 110-1 through 110-n will be described in detail with reference to FIGS. 2 through 6.

FIGS. 2 through 6 illustrate examples of an operation of a battery state estimation apparatus.

Figure 2:
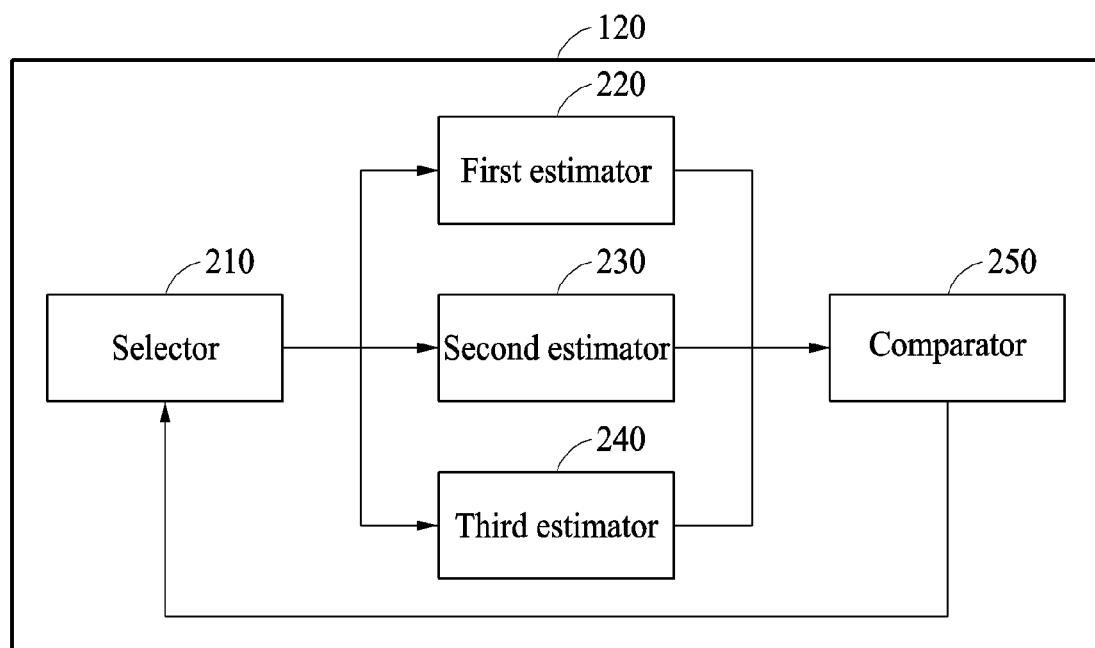
FIGS. 2 through 6 illustrate examples of an operation of a battery state estimation apparatus.

Referring to FIG. 2, the battery state estimation apparatus 120 includes a selector 210, a first estimator 220, a second estimator 230, a third estimator 240, and a comparator 250.

The selector 210 transmits sensing data of the batteries 110-1 through 110-n to the first estimator 220, the second estimator 230, and the third estimator 240. In an $N^{th}$ update period, the selector 210 selects sensing data of a maximum battery and transmits the sensing data to the first estimator 220, selects sensing data of a minimum battery and transmits the sensing data to the second estimator 230, and transmits sensing data of a remaining battery, other than the maximum battery and the minimum battery, to the third estimator 240. The maximum battery and the minimum battery are determined by the comparator 250 in a previous update period of the $N^{th}$ update periods. A battery having a maximum value of final state information of the batteries 110-1 through 110-n for the previous update period corresponds to the maximum battery and a battery having a minimum value thereof corresponds to the minimum battery.

The first estimator 220 determines state information of the maximum battery, which was determined by the comparator 250, based on the sensing data of the maximum battery. In the $N^{th}$ update period, the first estimator 220 determines the state information of the maximum battery based on the sensing data of the maximum battery and a first battery model. The first estimator 220 transmits final state information of the maximum battery obtained in the $N^{th}$ update period to the comparator 250.

The second estimator 230 determines state information of the minimum battery, which was determined by the comparator 250, based on the sensing data of the minimum battery. In the $N^{th}$ update period, the second estimator 230 determines the state information of the minimum battery based on the sensing data of the minimum battery and a second battery model. The second estimator 230 transmits final state information of the minimum battery obtained in the $N^{th}$ update period to the comparator 250.

The third estimator 240 determines state information of remaining batteries of the batteries 110-1 through 110-n, other than the maximum battery and the minimum battery. In the $N^{th}$ update period, the third estimator 240 selects a target battery for each of the switching periods. An unselected battery of the corresponding switching period is referred to as a non-target battery. In each of the switching periods, the third estimator 240 determines state information of a target battery of the corresponding switching period using sensing data of the target battery and a third battery model. State information of the non-target battery in each of the switching periods is determined based on state information of the non-target battery for a previous switching period and a state change amount for the corresponding switching period. The state change amount corresponds to, for example, any one or an average of any combination of a state change amount obtained through a coulomb counting for the corresponding switching period, a state change amount of the maximum battery for the corresponding switching period, and a state change amount of the minimum battery for the corresponding switching period. The state change amount will be further described later.

The third estimator 240 uses a third battery model when determining the state information of the target battery. The target battery also indicates, for example, a battery of which state information is determined using the third battery model in a switching period, the battery being included in the remaining batteries other than the maximum battery and minimum battery. The third estimator 240 does not use the third battery model when determining the state information of the non-target battery. The third estimator 240 transmits final state information of the remaining batteries obtained in the $N^{th}$ update period to the comparator 250.

The first battery model, the second battery model, and the third battery model are, for example, an electrical circuit model and an electrochemical model, but not be limited thereto.

The third estimator 240 includes a single battery model, for example, the third battery model. Depending on an example, when a number of the batteries 110-1 through 110-n exceeds a threshold, for example, 20, the third estimator 240 may also include more than one battery model.

The comparator 250 compares the final state information of the batteries 110-1 through 110-n and determines the maximum battery and the minimum battery again based on a result of the comparison.

Hereinafter, the selector 210, the first estimator 220, the second estimator 230, and the third estimator 240, and the comparator 250 operating in the $N^{th}$ update period will be further described with reference to FIGS. 3 through 6.

Figure 3:
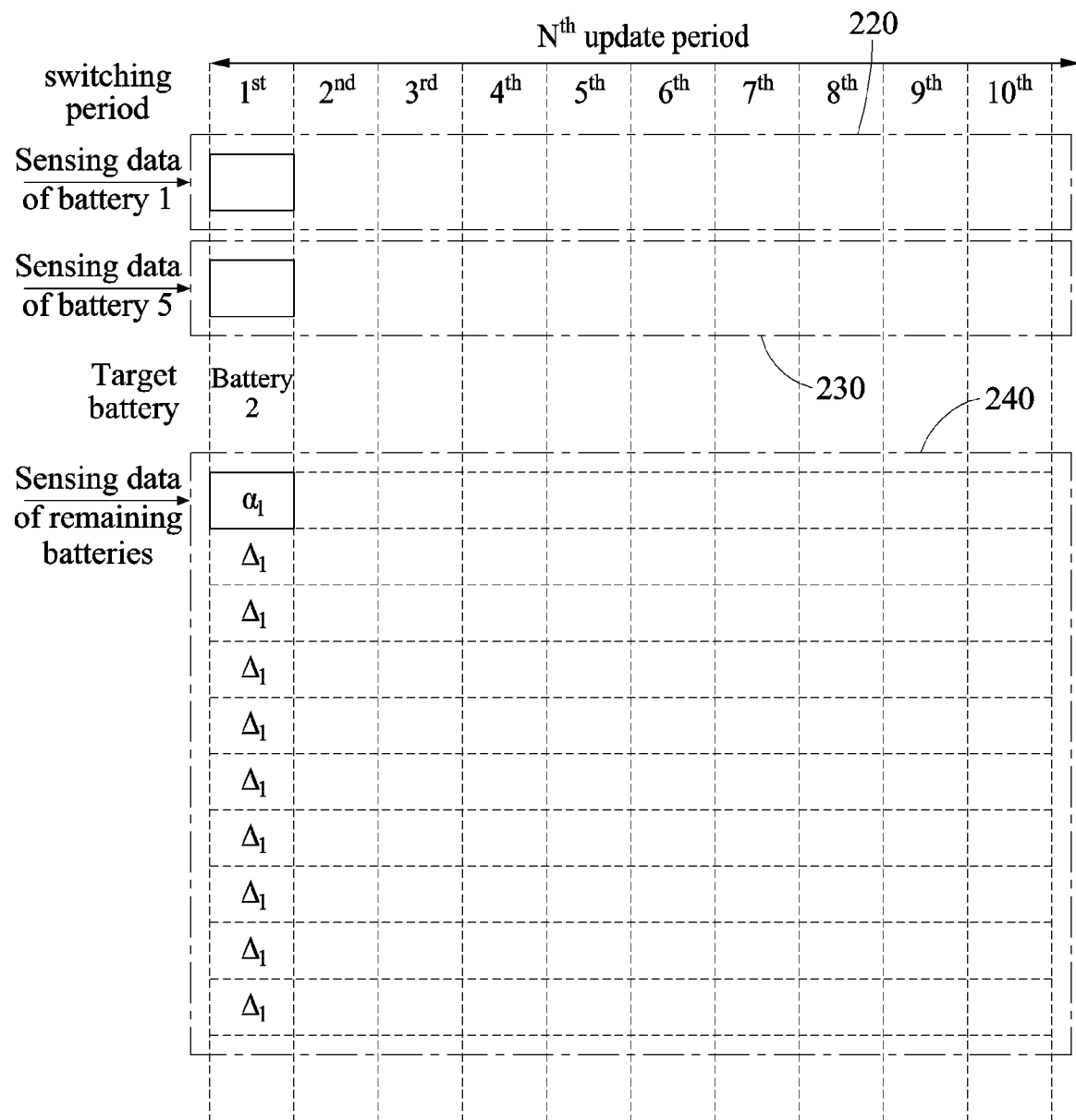

In an example of FIG. 3, among batteries 1 through 12, the battery 1 is a maximum battery and the battery 5 is a minimum battery. In this example, the first estimator 220 receives sensing data of the battery 1 from the selector 210 in an $N^{th}$ update period. Also, the second estimator 230 receives sensing data of the battery 5 from the selector 210 in the $N^{th}$ update period. For example, $SOC_{N-1}$ #1, $SOC_{N-1}$ #2, ..., $SOC_{N-1}$ #12 are state information of the batteries 1 through 12 for an $(N-1)^{th}$ update period. When $SOC_{N-1}$ #1 is a maximum value and $SOC_{N-1}$ #5 is a minimum value among the state information, the comparator 250 determines the battery 1 to be the maximum battery of the $N^{th}$ update period, determines the battery 5 to be the minimum battery of the $N^{th}$ update period, and transmits identification information "1" of the battery 1 and identification information "5" of the battery 5 to the selector 210. When the $(N-1)^{th}$ update period ends and the $N^{th}$ update period starts, the selector 210 transmits the sensing data of the battery 1 to the first estimator 220 and transmits the sensing data of the battery 5 to the second estimator 230.

The third estimator 240 receives sensing data of remaining batteries, for example, the batteries 2 through 4 and 6 through 12, among the batteries 1 through 12 other than the batteries 1 and 5 from the selector 210 in the $N^{th}$ update period.

The first estimator 220 determines the state information of the battery 1, $SOC_{N\_1}$ #1 using the sensing data of the battery 1 and a first battery model in a $1^{st}$ switching period of the $N^{th}$ update period. $SOC_{N\_1}$ #1 corresponds to a result of a calculation performed by the first battery model using the sensing data of the battery 1. In $SOC_{N\_1}$ #1, the subscript N denotes the $N^{th}$ update period, the subscript 1 denotes the $1^{st}$ switching period, and #1 denotes the battery 1.

The second estimator 230 determines the state information of the battery 5, $SOC_{N\_1}$ #5 using the sensing data of the battery 5 and a second battery model in the $1^{st}$ switching period of the $N^{th}$ update period. $SOC_{N\_1}$ #5 corresponds to a result of a calculation performed by the second battery model using the sensing data of the battery 5.

The third estimator 240 selects the battery 2 as a target battery of the $1^{st}$ switching period of the $N^{th}$ update period based on a switching order of the remaining batteries, other than the batteries 1 and 5. The switching order will be further described with reference to FIG. 7. In the $1^{st}$ switching period, the batteries 3, 4 and 6 through 12 correspond to non-target batteries.

The third estimator 240 determines state information of the target battery for the $1^{st}$ switching period. The third estimator 240 extracts sensing data corresponding to the $1^{st}$ switching period from sensing data of the battery 2 and determines state information of the battery 2 for the $1^{st}$ switching period, $\alpha_1$ using the extracted sensing data and a third battery model. $\alpha_1$ corresponds to a result of a calculation performed by the third battery model using the extracted sensing data.

The third estimator 240 determines state information of a non-target battery for the $1^{st}$ switching period. The third estimator 240 calculates a state change amount $\Delta_1$ for the $1^{st}$ switching period. In an example, the third estimator 240 determines the state information of the non-target battery based on the state change amount $\Delta_1$ and final state information of the non-target battery obtained in the $(N-1)^{th}$ update period. The state change amount $\Delta_1$ is, for example, any one or an average of any combination of $\Delta SOC_{coulomb\ counting}$ that is a state change amount obtained through a coulomb counting for the $1^{st}$ switching period, $\Delta SOC_{N\_1}$ #1 that is a state information change amount of the battery 1 for the $1^{st}$ switching period, and $\Delta SOC_{N\_1}$ #5 that is a state information change amount of the battery 5 for the $1^{st}$ switching period. $\Delta SOC_{coulomb\ counting}$ will be further described later.

The third estimator 240 obtains $SOC_{N-1}$ #3+$\Delta_1$ by adding the state change amount $\Delta_1$ to final state information of the battery 3 for the $(N-1)^{th}$ update period, $SOC_{N-1}$ #3, and determines $SOC_{N-1}$ #3+$\Delta_1$ to be state information of the battery 3 for the 1 switching period.

Likewise, the third estimator 240 determines state information of remaining non-target batteries for the $1^{st}$ switching period by adding the state change amount $\Delta_1$ to state information of the remaining non-target batteries for the $(N-1)^{th}$ update period.

Table 1 shows an example of state information of the batteries 1 through 12 for the $1^{st}$ switching period.

TABLE 1

| Battery | State information |
|---|---|
| Battery 1 | $SOC_{N\_1}$ #1 |
| Battery 2 | $\alpha_1$ |
| Battery 3 | $SOC_{N-1}$ #3 + $\Delta_1$ |
| Battery 4 | $SOC_{N-1}$ #4 + $\Delta_1$ |
| Battery 5 | $SOC_{N\_1}$ #5 |
| Battery 6 | $SOC_{N-1}$ #6 + $\Delta_1$ |
| Battery 7 | $SOC_{N-1}$ #7 + $\Delta_1$ |
| Battery 8 | $SOC_{N-1}$ #8 + $\Delta_1$ |
| Battery 9 | $SOC_{N-1}$ #9 + $\Delta_1$ |
| Battery 10 | $SOC_{N-1}$ #10 + $\Delta_1$ |
| Battery 11 | $SOC_{N-1}$ #11 + $\Delta_1$ |
| Battery 12 | $SOC_{N-1}$ #12 + $\Delta_1$ |

$\Delta SOC_{coulomb\ counting}$ included in the state change amount $\Delta_1$ is calculated using Equation 1.

$$\Delta SOC_{coulomb\ counting} = \frac{\int_{t_1}^{t_2} I dt}{\text{reference capacity}} \quad \text{[Equation 1]}$$

In Equation 1, $t_1$ denotes a starting point in time of the $1^{st}$ switching period, $t_2$ denotes an ending point in time of the $1^{st}$ switching period, reference capacity is a preset value and represents a total capacity of a battery of the same type as the batteries 1 through 12, and I denotes currents of the batteries 1 through 12. When the batteries 1 through 12 are connected in series, the same current flows in the batteries 1 through 12. For this reason, as shown in Table 1, the third estimator 240 uses the same $\Delta SOC_{coulomb\ counting}$ to determine the state information of the batteries 3, 4 and 6 through 12. For example, the batteries 1 through 12 may be connected in parallel. In this example, when different currents flow in the batteries 1 through 12, the third estimator 240 calculates state change amounts of the batteries 3, 4 and 6 through 12 due to the coulomb counting based on the reference capacity and current sensing results of the batteries 3, 4 and 6 through 12 for the $1^{st}$ switching period. Here, instead of each of the current sensing results for the $1^{st}$ switching period, a value obtained by dividing an amount of current flowing in the batteries 1 through 12 connected in parallel for the $1^{st}$ switching period by a number of batteries, for example, an average current amount may be used. When the current sensing results for the $1^{st}$ switching period are absent, the average current amount is used to calculate the state change amounts of the batteries 3, 4 and 6 through 12 due to the coulomb counting. The third estimator 240 determines the state information of the batteries 3, 4 and 6 through 12 for the $1^{st}$ switching period by adding the state change mounts of the batteries 3, 4 and 6 through 12 due to the coulomb counting to state information of the batteries 3, 4 and 6 through 12 for the $(N-1)^{th}$ update period.

Figure 4:
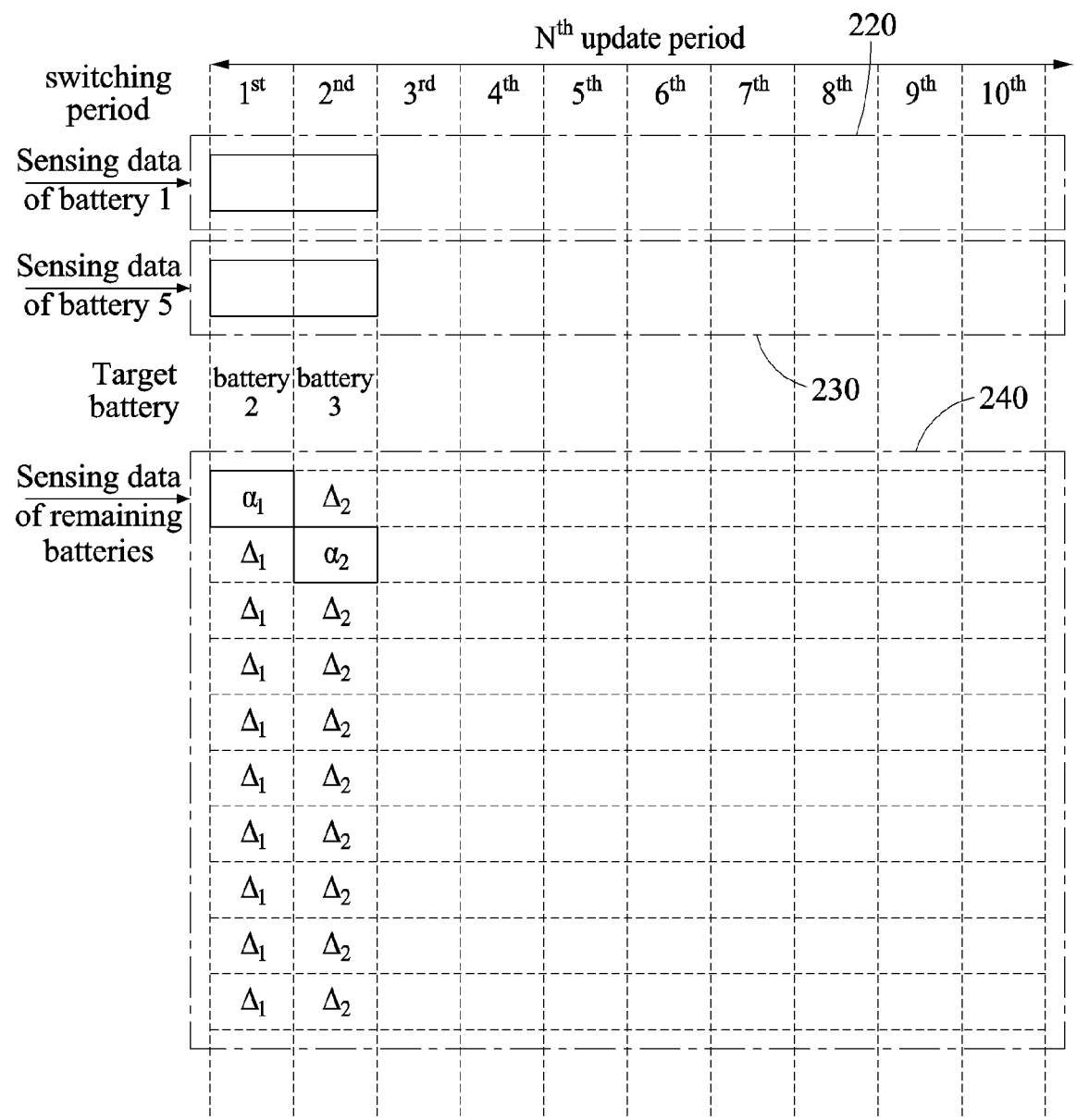

Referring to FIG. 4, in a $2^{nd}$ switching period, the first estimator 220 determines state information of the battery 1, $SOC_{N\_2}$ #1 using sensing data of the battery 1 and a first battery model. Also, the second estimator 230 determines state information of the battery 5, $SOC_{N\_2}$ #5 using sensing data of the battery 5 and a second battery model in the $2^{nd}$ switching period. In the $N^{th}$ update period, the first estimator 220 determines the state information of the battery 1 and the second estimator 230 determines the state information of the battery 5.

The third estimator 240 selects the battery 3 as a target battery of the $2^{nd}$ switching period based on a switching order. In the $2^{nd}$ switching period, among the remaining batteries other than the batteries 1 and 5, the batteries 2, 4 and 6 through 12 correspond to non-target batteries. In an example, the battery 2 which is selected as the target battery in the $1^{st}$ switching period corresponds to a non-target battery in other switching periods.

The third estimator 240 extracts sensing data corresponding to the $2^{nd}$ switching period from sensing data of the battery 3 and determines state information of the battery 3 for the $2^{nd}$ switching period, $\alpha_2$ using the extracted sensing data and a third battery model.

The third estimator 240 inputs the extracted sensing data to the third battery model. The third battery model acquires the state information of the battery 3 for the $2^{nd}$ switching period from input data and outputs the acquired state information. In an example, the third estimator 240 corrects $\alpha_2$.

Figure 5:
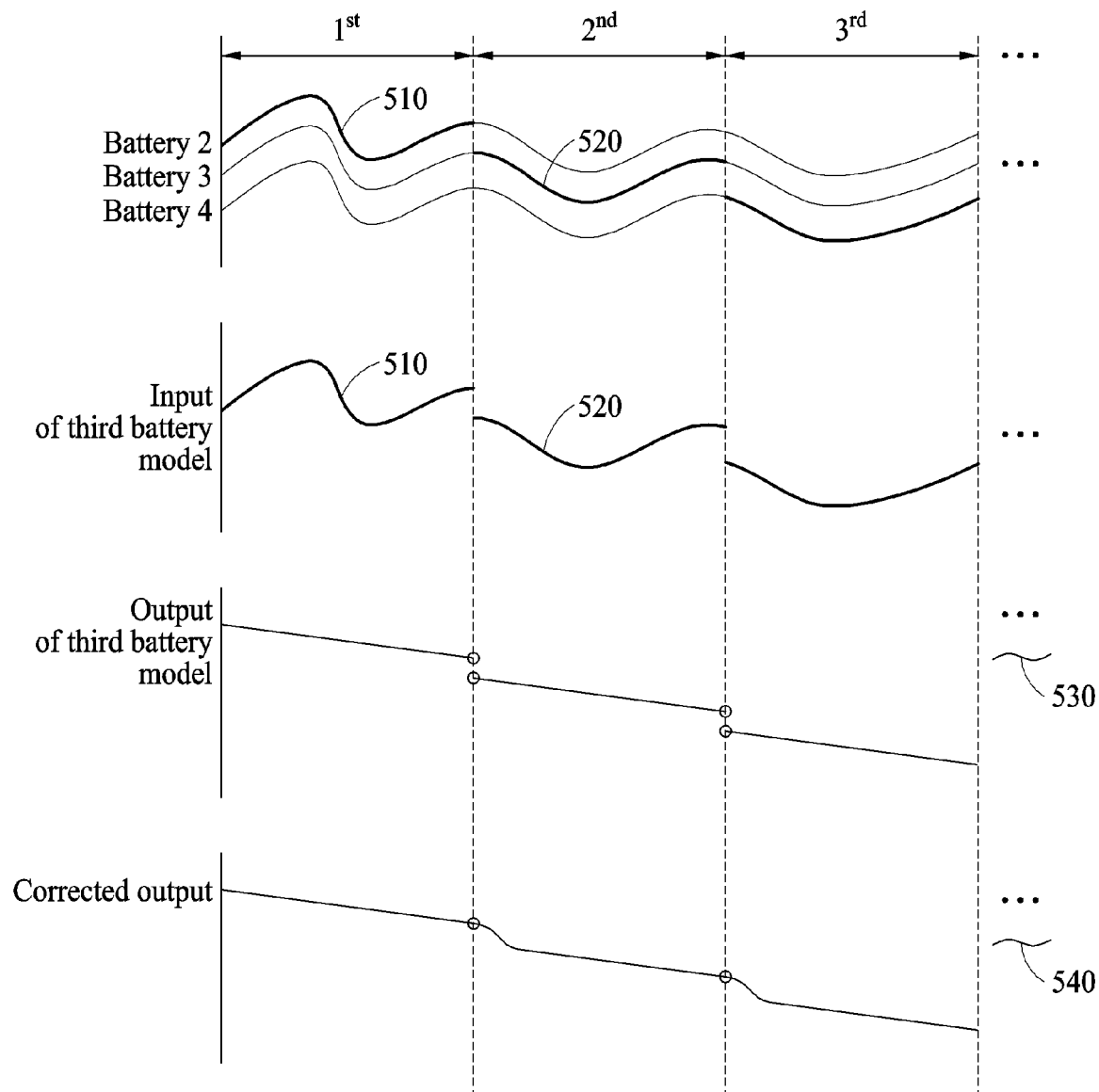

With reference to FIG. 5, the correction is done because a target battery is switched from the battery 2 to the battery 3 in $2^{nd}$ switching period. Thus, the third battery model receives sensing data of the battery 3 instead of sensing data of the battery 2. A discontinuity occurs between input data 510 and input data 520 of the third battery model at a switching point in time. When the third battery model outputs the state information acquired from the input data 520 with the discontinuity, an output of the third battery model is discontinuous at the switching point in time as shown in a graph 530. The third estimator 240 corrects the output of the third battery model for each of the switching periods using a correction model or a filter, such as, for example, a Kalman filter. The corrected output is continuous as shown in a graph 540. Depending on an example, the third battery model may have a correcting function, so that an output of the third battery model is continuous as represented by the graph 540.

Referring back to FIG. 4, the third estimator 240 calculates a state change amount $\Delta_2$ for the $2^{nd}$ switching period. The description of the state change amount $\Delta_1$ is also applicable to the state change amount $\Delta_2$ and are incorporated herein by reference. Thus, the above description may not be repeated here. The third estimator 240 determines the state information of the non-target battery of the $2^{nd}$ switching period based on the state change amount $\Delta_2$ and state information of the non-target battery, for example, the batteries 2, 4 and 6 through 12 for a switching period that is prior to the $2^{nd}$ switching period. The third estimator 240 determines state information of the battery 2 by adding the state change mount $\Delta_2$ to $\alpha_1$ that is the state information of the battery 2 for the $1^{st}$ switching period. Also, the third estimator 240 determines state information of the battery 4 by adding the state change amount $\Delta_2$ to state information of the battery 4 for the $1^{st}$ switching period, $SOC_{N-1}$ #4+$\Delta_1$. Likewise, the third estimator 240 determines state information of the batteries 6 through 12 for the $2^{nd}$ switching period. Table 2 shows an example of state information of the batteries 1 through 12 for the $2^{nd}$ switching period.

TABLE 2

| Battery | State information |
|---|---|
| Battery 1 | $SOC_{N\_2}$ #1 |
| Battery 2 | $\alpha_1 + \Delta_2$ |
| Battery 3 | $\alpha_2$ |
| Battery 4 | $SOC_{N-1}$ #4 + $\Delta_1 + \Delta_2$ |
| Battery 5 | $SOC_{N\_2}$ #5 |
| Battery 6 | $SOC_{N-1}$ #6 + $\Delta_1 + \Delta_2$ |
| Battery 7 | $SOC_{N-1}$ #7 + $\Delta_1 + \Delta_2$ |
| Battery 8 | $SOC_{N-1}$ #8 + $\Delta_1 + \Delta_2$ |
| Battery 9 | $SOC_{N-1}$ #9 + $\Delta_1 + \Delta_2$ |
| Battery 10 | $SOC_{N-1}$ #10 + $\Delta_1 + \Delta_2$ |
| Battery 11 | $SOC_{N-1}$ #11 + $\Delta_1 + \Delta_2$ |
| Battery 12 | $SOC_{N-1}$ #12 + $\Delta_1 + \Delta_2$ |

In each of remaining switching periods of the $N^{th}$ update period, the first estimator 220, the second estimator 230, and the third estimator 240 operate as described with reference to FIGS. 3 through 5.

Figure 6:
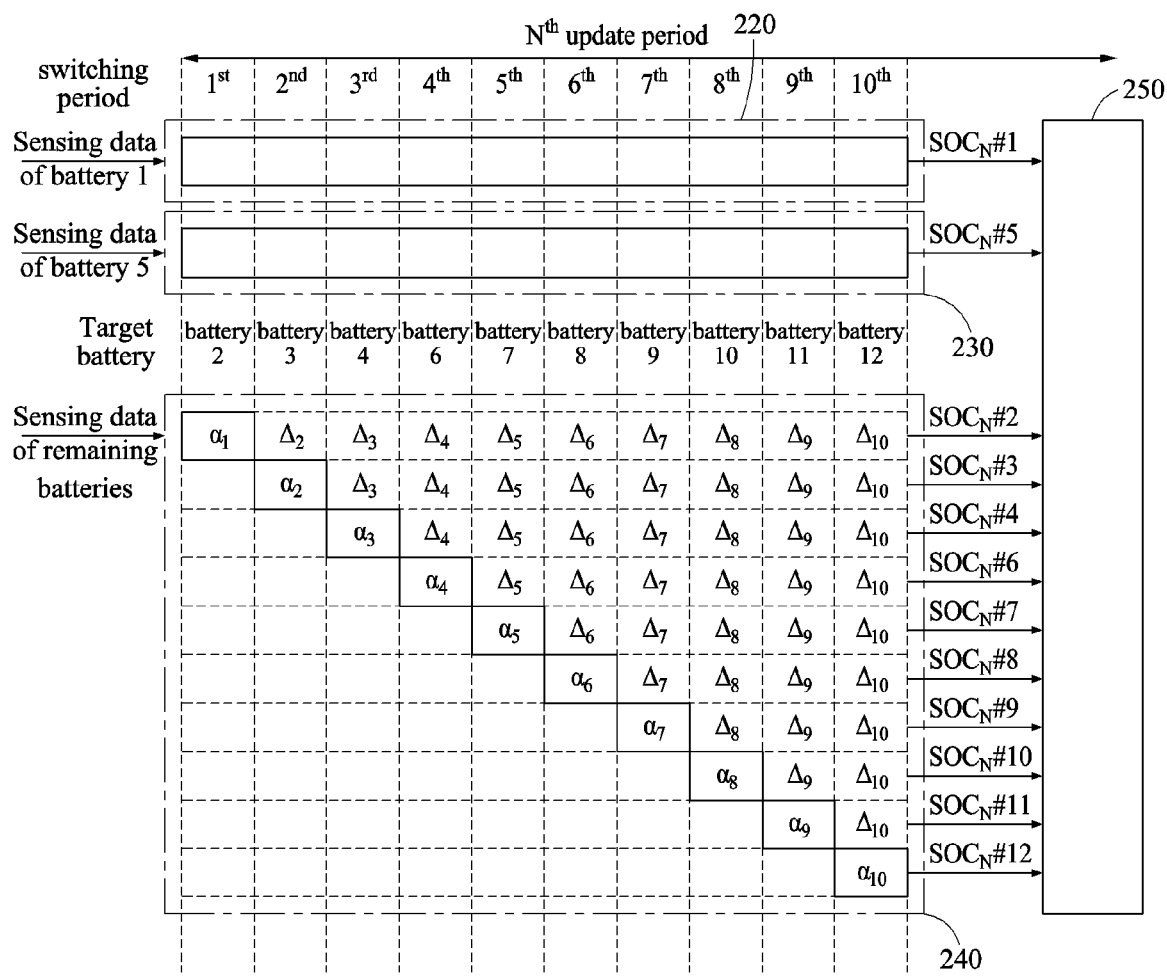

FIG. 6 illustrates an example of the results of the operation of first estimator 220, the second estimator 230, and the third estimator 240 for the $N^{th}$ update period. Referring to FIG. 6, the first estimator 220 determines state information of the battery 1 using sensing data of the battery 1 and a first battery model in overall switching periods. The second estimator 230 determines state information of the battery 5 using sensing data of the battery 5 and a second battery model in the overall switching periods. An output $SOC_N$ #1 of the first estimator 220 corresponds to final state information of the battery 1 determined in the $N^{th}$ update period. An output $SOC_N$ #5 of the second estimator 230 corresponds to final state information of the battery 5 determined in the $N^{th}$ update period.

The third estimator 240 determines state information of a target battery for each of the switching periods of the $N^{th}$ update period based on sensing data of the target battery of the corresponding switching period and a third battery model. Also, the third estimator 240 determines state information of a non-target battery for each of the switching periods of the $N^{th}$ update period based on state information of the non-target battery for a previous switching period and a state change amount of the non-target battery for the corresponding switching period. For example, the third estimator 240 determines state information of the battery 12 which is a target battery of a last switching period based on sensing data of the battery 12 for the last switching period and the third battery model. Also, the third estimator 240 determines state information of the battery 2 for the last switching period by adding a state change amount $\Delta_{10}$ of the battery 2 for the last switching period to "$\alpha_1+\Delta_2+\Delta_3+\ldots+\Delta_9$" that is state information of the battery 2 for a $9^{th}$ switching period.

Table 3 shows an example of final state information of the batteries 1 through 12 determined in the $N^{th}$ update period.

TABLE 3

| Battery | Final state information |
|---|---|
| Battery 1 | $SOC_N$ #1 |
| Battery 2 | $SOC_N$ #2 = $\alpha_1 + \Delta_2 + \Delta_3 + \ldots + \Delta_{10}$ |
| Battery 3 | $SOC_N$ #3 = $\alpha_2 + \Delta_3 + \ldots + \Delta_{10}$ |
| Battery 4 | $SOC_N$ #4 = $\alpha_3 + \Delta_4 + \ldots + \Delta_{10}$ |
| Battery 5 | $SOC_N$ #5 |
| Battery 6 | $SOC_N$ #6 = $\alpha_4 + \Delta_5 + \ldots + \Delta_{10}$ |
| Battery 7 | $SOC_N$ #7 = $\alpha_5 + \Delta_6 + \ldots + \Delta_{10}$ |
| Battery 8 | $SOC_N$ #8 = $\alpha_6 + \Delta_7 + \ldots + \Delta_{10}$ |
| Battery 9 | $SOC_N$ #9 = $\alpha_7 + \Delta_8 + \Delta_9 + \Delta_{10}$ |
| Battery 10 | $SOC_N$ #10 = $\alpha_8 + \Delta_9 + \Delta_{10}$ |
| Battery 11 | $SOC_N$ #11 = $\alpha_9 + \Delta_{10}$ |
| Battery 12 | $SOC_N$ #12 = $\alpha_{10}$ |

The comparator 250 receives $SOC_N$ #1, . . . , $SOC_N$ #12 from the first estimator 220, the second estimator 230, and the third estimator 240. In another iteration, the comparator 250 determines a maximum battery and/or a minimum battery based on $SOC_N$ #1, . . . , $SOC_N$ #12. In an example, where $SOC_N$ #3 is a maximum value and $SOC_N$ #8 is a minimum value, the comparator 250 determines the battery 3 to be the maximum battery and determines the battery 8 to be the minimum battery.

The comparator 250 transmits information on the maximum battery and/or the minimum battery to the selector 210. The comparator 250 transmits identification information "3" of the battery 3 and identification information "8" of the battery 8 to the selector 210. In an $(N+1)^{th}$ update period, the selector 210 inputs the sensing data of the battery 3 to the first estimator 220, inputs the sensing data of the battery 8 to the second estimator 230, and inputs sensing data of remaining batteries among the batteries 1 through 12, other than the batteries 3 and 8, to the third estimator 240. The description of the operation performed by the first estimator 220, the second estimator 230, and the third estimator 240 in the $N^{th}$ update period is also applicable to an operation performed by the first estimator 220, the second estimator 230, and the third estimator 240 in the $(N+1)^{th}$ update period and are incorporated herein by reference. Thus, the above description may not be repeated here.

FIGS. 7 through 10 illustrate examples of a switching order.

The third estimator 240 selects one of remaining batteries as a target battery for each of switching periods based on a switching order of the remaining batteries.

Figure 7:
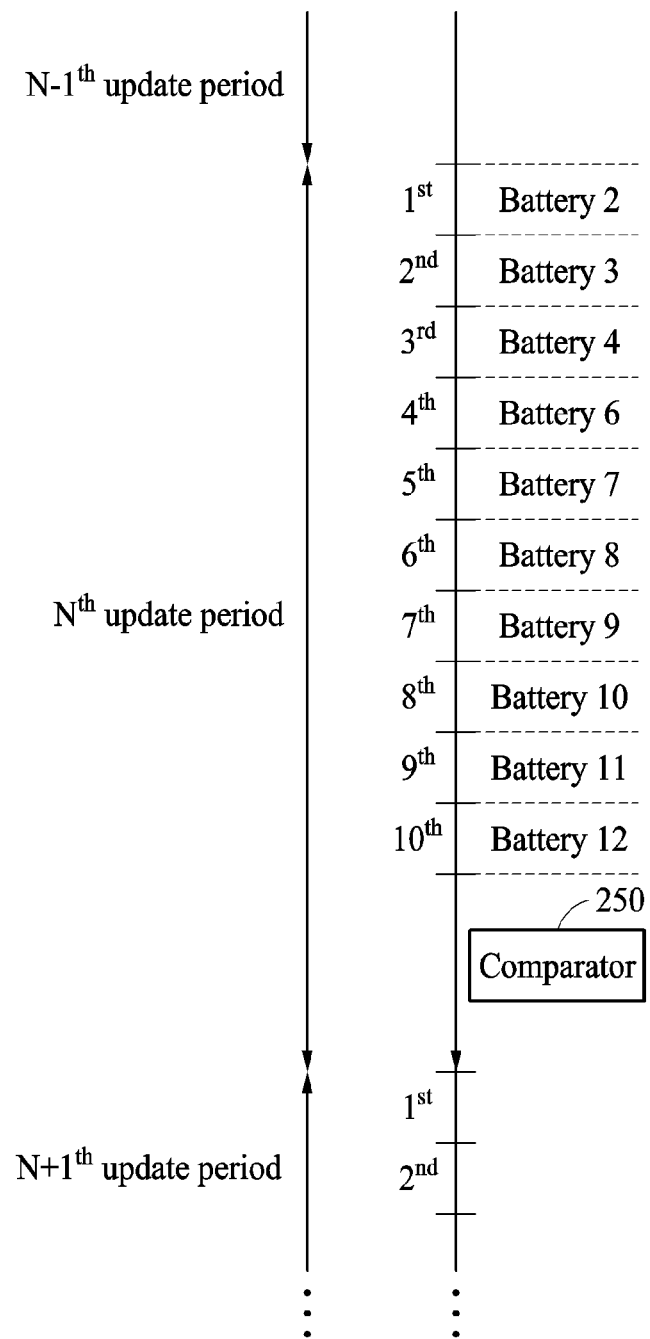
FIGS. 7 through 10 illustrate examples of a switching order.

In an example, a switching order is an order of identification information of the remaining batteries. Referring to FIG. 7, in an example, in a $1^{st}$ switching period of an $N^{th}$ update period, the third estimator 240 selects a battery 2 having smallest identification information from batteries 2, 3, 4 and 6 through 12 other than batteries 1 and 5 as a target battery of the $1^{st}$ switching period. In an example, in a $2^{nd}$ switching period, the third estimator 240 selects the battery 3 having smallest identification information from the batteries 3, 4 and 6 through 12 as a target battery of the $2^{nd}$ switching period. The third estimator 240 switches the target battery from the battery 2 to the battery 3 in the $2^{nd}$ switching period. In an example, in a last switching period, the third estimator 240 selects the battery 12 as a target battery of the last switching period. In another example, the third estimator 240 selects the battery 12 having greatest identification information from the remaining batteries as the target battery of the $1^{st}$ switching period. In this example, the third estimator 240 selects the battery 2 as the target battery of the last switching period.

Figure 8:
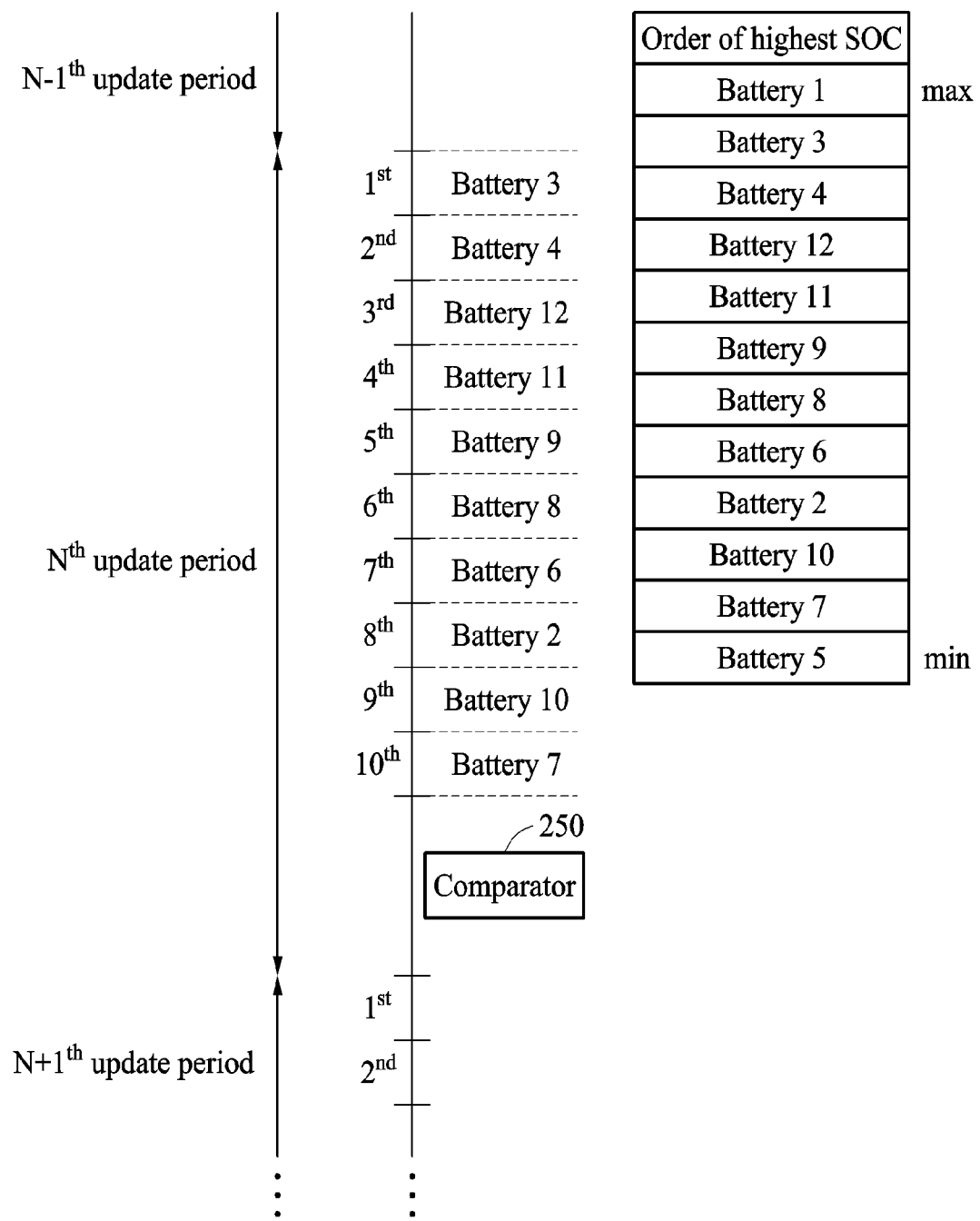

In an example, a switching order is an order of final state information of remaining batteries for a previous update period. Referring to FIG. 8, in the $1^{st}$ switching period of the $N^{th}$ update period, the third estimator 240 selects the battery 3 having greatest final state information in an $(N-1)^{th}$ update period from the batteries 2, 3, 4 and 6 through 12 other than the batteries 1 and 5 as a target battery of the $1^{st}$ switching period. In the $2^{nd}$ switching period, the third estimator 240 selects the battery 4 having greatest final state information from the batteries 2, 4 and 6 through 12 as a target battery of the $2^{nd}$ switching period. Also, in the last switching period, the third estimator 240 selects the battery 7 as a target battery of the last switching period. In another an example, the third estimator 240 selects the battery 7 having smallest final state information in the $(N-1)^{th}$ update period from the remaining batteries as the target battery of the $1^{st}$ switching period. In this example, the third estimator 240 selects the battery 3 in the last switching period as the target battery of the last switching period.

In an example, the third estimator 240 switches target batteries in a voltage order of remaining batteries. The third estimator 240 receives voltage data of the remaining batteries from the selector 210. The third estimator 240 switches target batteries during the $N^{th}$ update period in an ascending or descending order of voltages of the remaining batteries.

In an example, the third estimator 240 randomly switches target batteries.

When final state information of the batteries 110-1 through 110-$n$ is determined in the $N^{th}$ update period, the comparator 250 determines a maximum battery and/or a minimum battery again based on the determined final state information. Also, the comparator 250 determines a switching order for an $(N+1)^{th}$ update period based on the aforementioned examples.

Figure 9:
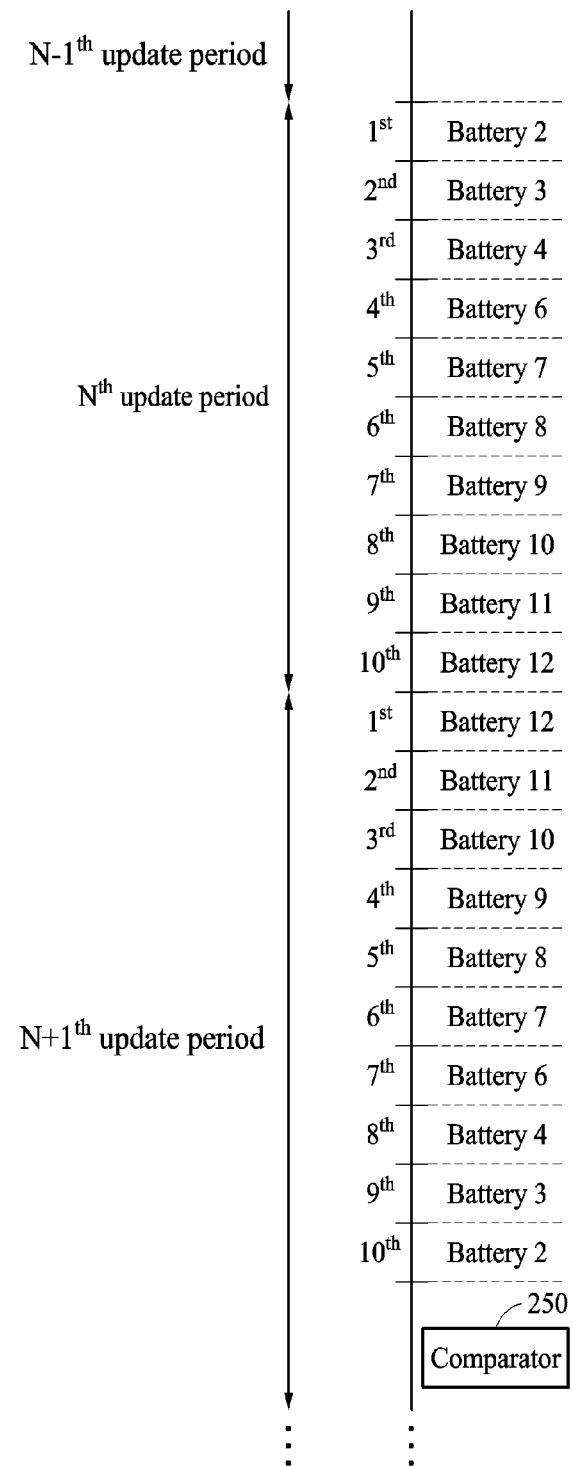

In an example, during an $(N+1)^{th}$ update period, the third estimator 240 switches target batteries among remaining batteries in a reverse order of a switching order of an $N^{th}$ update period. Referring to FIG. 9, when target batteries are switched during an $N^{th}$ update period based on the switching order as illustrated in FIG. 7, the third estimator 240 switches target batteries in a reverse order of the switching order during an $(N+1)^{th}$ update period. For example, in a $1^{st}$ switching period of the $(N+1)^{th}$ update period, the third estimator 240 selects the battery 12 as a target battery of the $1^{st}$ switching period from the remaining batteries except for the batteries 1 and 5 among the batteries 1 through 12, and switches a target battery from the batter 12 to the battery 11 in a $2^{nd}$ switching period of the $(N+1)^{th}$ update period. Also, the third estimator 240 switches a target battery from the battery 3 to the battery 2 in a last switching period of the $(N+1)^{th}$ update period.

Figure 10:
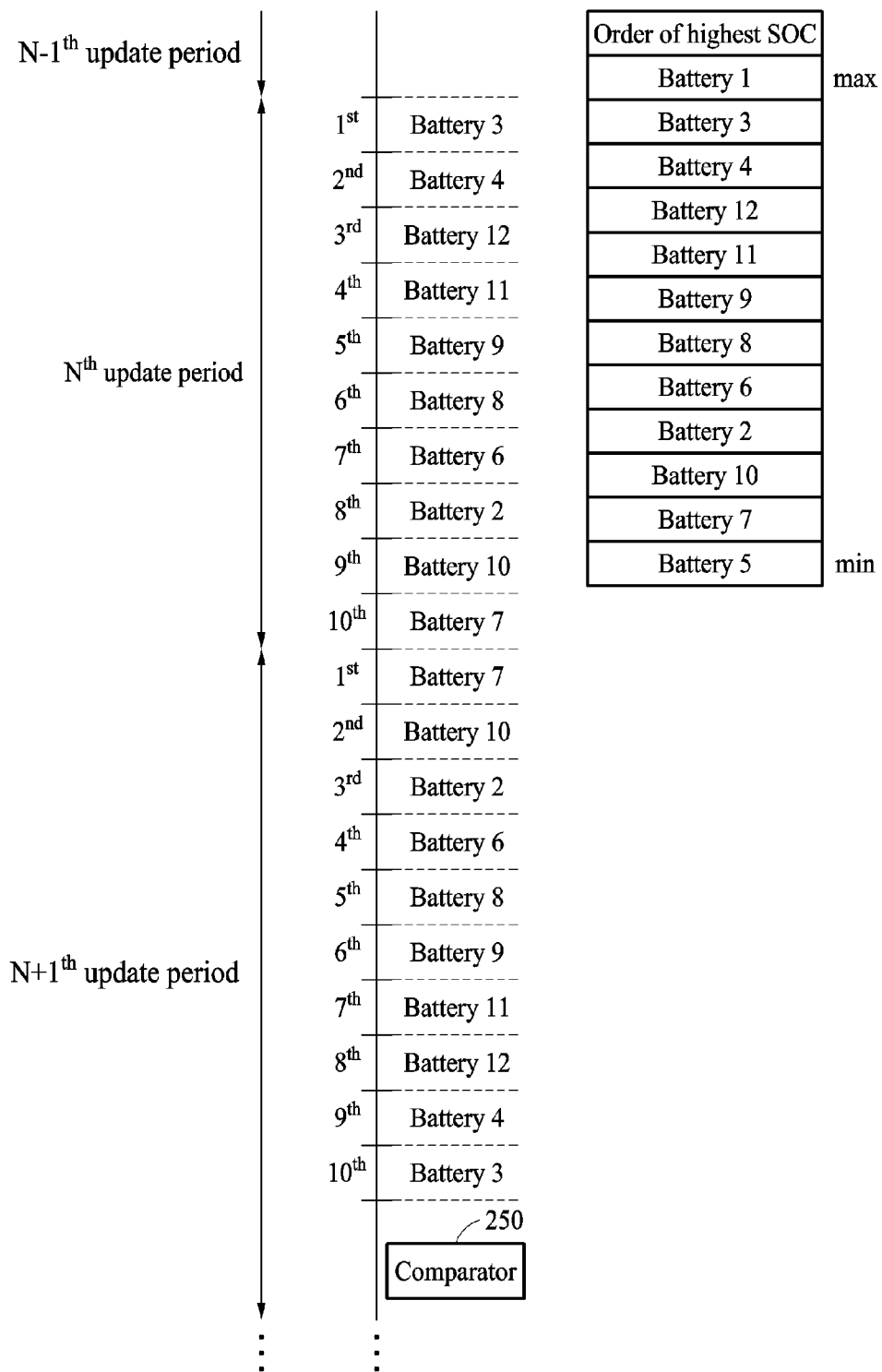

Referring to FIG. 10, when target batteries are switched during the $N^{th}$ update period based on the switching order as illustrated in FIG. 8, the third estimator 240 selects the battery 7 as a target battery of the $1^{st}$ switching period of the $(N+1)^{th}$ update period, from the remaining batteries except for the batteries 1 and 5 among the batteries 1 through 12, and switches a target battery from the battery 7 to the battery 10 in the $2^{nd}$ switching period of the $(N+1)^{th}$ update period. Also, the third estimator 240 switches a target battery from the battery 4 to the battery 3 in the last switching period of the $(N+1)^{th}$ update period.

The update period for the maximum battery and/or the minimum battery in the examples described with reference to FIGS. 7 and 8 may differ from the update period for the maximum battery and/or the minimum battery in the examples described with reference to FIGS. 9 and 10. The update period may be N in the examples of FIGS. 7 and 8 and the update period may be 2N in the examples of FIGS. 9 and 10.

Figure 11:
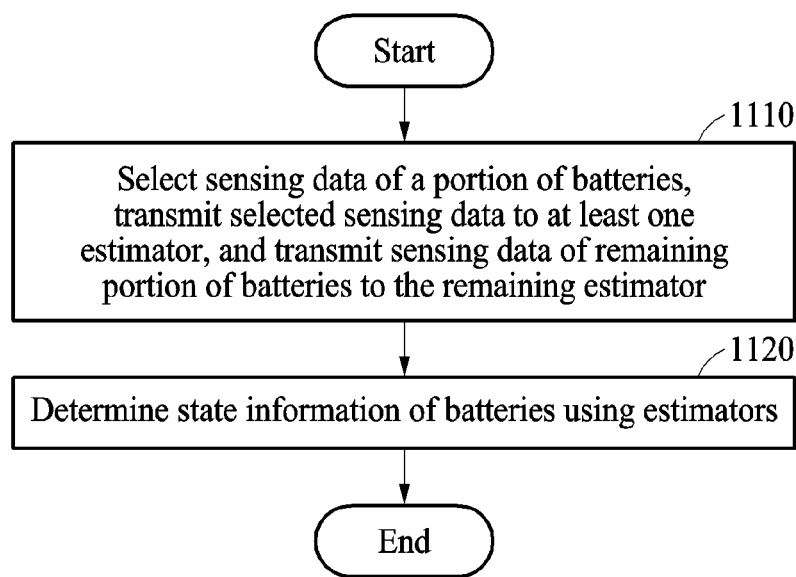
FIG. 11 illustrates an example of a battery state estimation method.

FIG. 11 illustrates an example of a battery state estimation method. The operations in FIG. 11 may be performed in the sequence and manner as shown, although the order of some operations may be changed or some of the operations omitted without departing from the spirit and scope of the illustrative examples described. Many of the operations shown in FIG. 11 may be performed in parallel or concurrently. One or more blocks of FIG. 11, and combinations of the blocks, can be implemented by special purpose hardware-based computer that perform the specified functions, or combinations of special purpose hardware and computer instructions. In addition to the description of FIG. 11 below, the descriptions of FIGS. 1-10 are also applicable to FIG. 11, and are incorporated herein by reference. Thus, the above description may not be repeated here.

A battery state estimation method is performed by the battery state estimation apparatus 120.

Referring to FIG. 11, in operation 1110, the battery state estimation apparatus 120 selects sensing data of a portion of the batteries 110-1 through 110-$n$, transmits the selected sensing data to at least one estimator, for example, the first estimator 220 and the second estimator 230 among the first estimator 220, the second estimator 230, and the third estimator 240. The battery state estimation apparatus 120 transmits sensing data of a remaining portion of the batteries 110-1 through 110-$n$ to a remaining estimator, for example, the third estimator 240. In an example, the batteries may correspond to one or more of the batteries, such as, for example, batteries 1 and 5 of the $N^{th}$ update period as described with reference to FIGS. 3 through 10. In an example, the remaining portion of the batteries 110-1 through 110-$n$ may correspond to the batteries 2 through 4 and 6 through 12, among the batteries 1 through 12 other than the batteries 1 and 5.

In operation 1120, the battery state estimation apparatus 120 determines state information of the batteries 110-1 through 110-$n$ using the first estimator 220, the second estimator 230, and the third estimator 240. The battery state estimation apparatus 120 determines state information of the portion using the first estimator 220 and the second estimator 230 based on the sensing data of the portion. The battery state estimation apparatus 120 determines state information of a target battery for each of switching periods using the third estimator 240 based on sensing data of the target battery of the corresponding switching period. Also, the battery state estimation apparatus 120 determines state information of a non-target battery for each of the switching periods using the third estimator 240 based on state information of the non-target battery for a previous switching period and a state change amount of the non-target battery for the corresponding switching period.

The battery state estimation apparatus 120 determines a maximum value or a minimum value of the determined state information of the batteries 110-1 through 110-$n$ to be state information of a battery set including the batteries 110-1 through 110-$n$. For example, when state information of batter cells included in a battery pack is determined, the battery state estimation apparatus 120 determines a maximum value or a minimum value of the determined state information of the battery cells to be state information of the battery pack.

Figure 12:
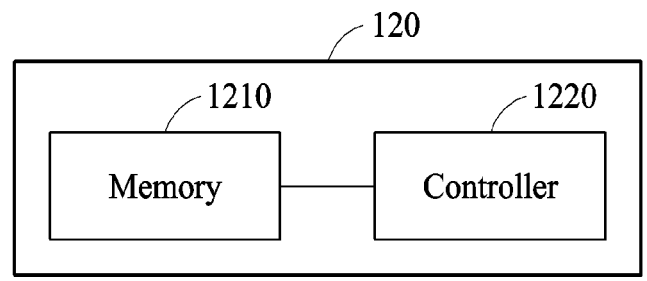
FIG. 12 illustrates an example of a battery state estimation apparatus.

FIG. 12 illustrates an example of a battery state estimation apparatus.

Referring to FIG. 12, the battery state estimation apparatus 120 includes a memory 1210 and a controller 1220.

The controller 1220 is coupled with the memory 1210. In an example, the controller 1220 implements the selector 210, the first estimator 220, the second estimator 230, the third estimator 240, and the comparator 250. Further details of the controller 1220 and the memory 1210 are provided below.

The battery state estimation apparatus 120 estimates an SOC of each of the batteries 110-1 through 110-$n$ based on the above-described methods, thereby obtaining a more accurate estimation result and reducing a calculation time when compared to an existing SOC estimation scheme, for example, an estimation scheme using an SOC-OCV look-up table.

The description of FIGS. 1 through 11 is also applicable to FIG. 12, and are incorporated herein by reference. Thus, the above description may not be repeated here.

The battery state estimation apparatus 120 is included in various apparatuses, such as, for example, a vehicle, a walking assistance device, a wearable device, a security device, a robot, a mobile terminal, and various Internet of Things (IoT) devices that use the batteries as a power source. The battery state estimation apparatus 120 performs the operations described with reference to FIG. 1 through 12. The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an intelligent vehicle, a self-driving vehicle, an unmanned aerial vehicle, an electric vehicle (EV), a hybrid vehicle, or a drone.

Hereinafter, examples of the battery state estimation apparatus 120 included in a vehicle will be described with reference to FIG. 13. The following description is also applicable to the battery state estimation apparatus 120 being disposed in other apparatuses, in addition to the vehicle.

Figure 13:
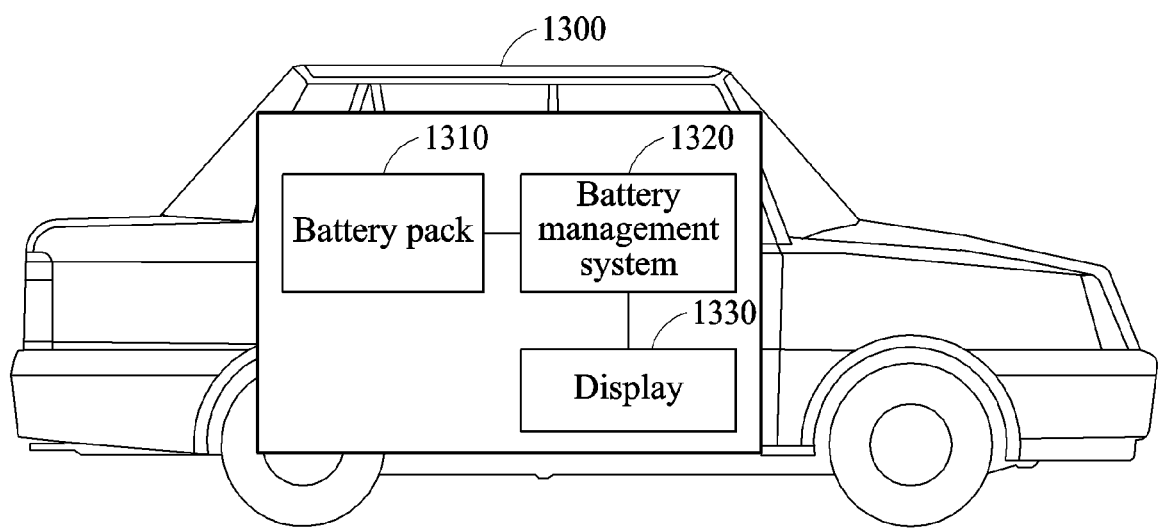
FIG. 13 illustrates an example of a vehicle.

FIG. 13 illustrates an example of a vehicle.

Referring to FIG. 13, a vehicle 1300 includes a battery pack 1310, a battery management system 1320, and a display 1330. The vehicle 1300 uses the battery pack 1310 including battery cells as a power source. The vehicle 1300 is, for example, an electric vehicle or a hybrid vehicle.

The battery management system 1320 monitors whether an abnormality occurs in the battery pack 1310 and prevents the battery pack 1310 from being overcharged or overdischarged. The battery management system 1320 performs a thermal control on the battery pack 1310 when a temperature of the battery pack 1310 is higher than a first temperature, for example, 40° C. or is lower than a second temperature, for example, −10° C. The battery management system 1320 performs a cell balancing such that states of charge of battery cells in the battery pack 1310 are equalized.

The battery management system 1310 performs a similar operation to that of the battery state estimation apparatus 120 to determine state information of the battery cells in the battery pack 1310. The description of FIGS. 1 through 12 is also applicable to the battery management system 1320 determining the state information of the battery cells. The description of FIGS. 1 through 12, and are incorporated herein by reference. Thus, the above description may not be repeated here.

The battery management system 1320 determines a maximum value or a minimum value of state information of the batteries cells to be state information of the battery pack 1310. The battery management system 1320 transmits the state information of the battery pack 1310 to an electronic control unit (ECU) or a vehicle control unit (VCU) of the vehicle 1300. The ECU or the VCU displays the state information of the battery pack 1310 on a display 1330 of the vehicle 1300. In an example, the display 1330 is a physical structure that includes one or more hardware components that provide the ability to render a user interface and/or receive user input. In an example, the state information of the battery pack 1310 is displayed on a wind shield glass or a separate screen of the vehicle using a head-up display (HUD) or is displayed on an augmented reality head-up display (AR HUD). However, the displaying of the object is not limited to the example described above, and any other instrument cluster, vehicular infotainment system, screen in the vehicle, or display panel in the vehicle may perform the display function. Other displays, such as, for example, smart phone and eye glass display (EGD) that are operatively connected to the battery management system 1320 may be used without departing from the spirit and scope of the illustrative examples described.

In an example, the battery state estimation apparatus 120 uses three battery models to sequentially estimate SOCs of all battery cells, thereby overcoming an inaccuracy of a voltage-based SOC estimation method and reducing time to calculate the SOC.

The battery state estimation apparatus 120, selector 210, first estimator 220, second estimator 230, third estimator 240, battery management system 1320, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the method of preventing the collision. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for estimating a state of a battery, the apparatus comprising:
 a sensor configured to sense data corresponding to batteries of a battery pack in an update period;
 a head-up display (HUD); and
 a processor comprising:
  a comparator configured to determine, in another update period prior to the update period, a maximum battery of the batteries having a maximum state information and a minimum battery of the batteries having a minimum state information,
  a selector configured to selectively transmit the data corresponding to each battery of the battery pack to a plurality of estimators,
  a first estimator of the plurality of estimators being configured to determine state information of the maximum battery based on sensing data of the maximum battery and a first battery model,
  a second estimator of the plurality of estimators being configured to determine state information of the minimum battery based on sensing data of the minimum battery and a second battery model,
  a third estimator of the plurality of estimators being configured to
   select, in a switching period of the update period, a target battery from remaining batteries, the remaining batteries being the batteries other than the maximum battery and the maximum battery,
   determine, in the switching period, state information of the target battery based on sensing data of the target battery and a third battery model, and
   determine, in the switching period, state information of the remaining batteries other than the target battery based on state information of the remaining batteries other than the target battery for another switching period that is prior to the switching period and a state change amount,
  wherein the processor is configured to output the state information of the maximum battery, the state information of the minimum battery, the state information of the maximum battery, and the state information of remaining batteries through the head-up display (HUD).

2. The apparatus of claim 1, wherein the state change amount comprises any one, any combination, or an average of a state change amount obtained through a coulomb counting for the switching period, a state change amount of the maximum battery for the switching period, and a state change amount of the minimum battery for the switching period.

3. The apparatus of claim 1, wherein the third estimator is further configured to select, other than the target battery, another target battery from the remaining batteries in other switching periods of the update periods.

* * * * *